United States Patent [19]

Everson

[11] Patent Number: 4,622,515
[45] Date of Patent: Nov. 11, 1986

[54] APPARATUS AND METHOD FOR CONTACTLESS CHARACTERIZATION OF PHOTODIODE MOSAICS

[75] Inventor: Jeffrey H. Everson, Reading, Mass.

[73] Assignee: Honeywell Inc., Minneapolis, Minn.

[21] Appl. No.: 581,386

[22] Filed: Feb. 17, 1984

[51] Int. Cl.[4] ............................................. G01R 31/26
[52] U.S. Cl. ............................ 324/158 D; 324/158 R
[58] Field of Search .......... 324/158 D, 158 R, 158 T, 324/73 R

[56] References Cited

PUBLICATIONS

Das et al; "Determination of . . . "; Applied Physics Letters; vol. 27; No. 3; Aug. 1, 1975; pp. 120–121.

Primary Examiner—Ernest F. Karlsen
Attorney, Agent, or Firm—John S. Solakian; Albin Medved

[57] ABSTRACT

An apparatus and method for noncontact and nondestructive test of a photodiode array are given. Such apparatus comprises a Surface Acoustic Wave (SAW) device having one or more sets of interdigital finger pairs placed on each end of the device, separated by slotted waveguide which confines the SAW test probe test signal to a row of diodes to be tested and which is positioned immediately above the waveguide. The SAW device is coupled to signal processing electronics from which individual detector properties, such as the zero voltage bias resistance of each detector, may be calculated.

14 Claims, 3 Drawing Figures

APPARATUS AND METHOD FOR CONTACTLESS CHARACTERIZATION OF PHOTODIODE MOSAICS

BACKGROUND OF THE INVENTION

The present invention relates to devices and methods for testing photodiodes, and, more particularly, to noncontact, nondestructive test devices and methods for photodiode detector arrays or mosaics.

Currently, the performance of two dimensional arrays of photodiode detectors may be tested by a variety of techniques, both contact and noncontact. The most common test procedure involves mechanically connecting (i.e., "bumping") the detector mosaic to a charge coupled device ("CCD") from which traditional performance measures, such as the zero voltage device resistance ("$r_o$") of the device, may be easily derived. However, this process is time-consuming and wasteful, especially if the detector performance is substandard. In such case, the detector mosaic is discarded, including the CCD which cannot be easily disconnected from the device.

Detector arrays or mosaics may also be characterized by mechanical probes which are moved sequentially across the mosaic, measuring the $r_o$ at each detector. Where large arrays are tested this approach can be extremely time-consuming. This process also requires metalization of the detector substrate and physical contact with that metalization. Thus, the detector may be physically damaged by the probe or possible inaccurate measurements may result due to electrical loading from the probe.

Electron beam ("e-beam") test devices which provide noncontact testing, nevertheless present similar problems. In e-beam testing, a known charge imparted by the e-beam is used to reverse bias each detector. The time required for this charge to dissipate is measured, from which, in combination with the amount of charge and other known parameters, the device quality may be calculated. One disadvantage of the e-beam technique is that it requires that gold contacts be formed over the N+ region of each photodiode to serve as a surface for e-beam illumination. This additional processing step is both expensive and time consuming. A second disadvantage of this technique is that a precise mask must be positioned over the detector array so that the e-beam will not strike the P substrate of the photodiode, which would destroy the device.

It is, accordingly, an object of the present invention to provide a completely noncontact, nondestructive device and method for testing photodiode detector arrays or mosaics which requires no special sample preparation of any kind, and which may be fully automated.

SUMMARY OF THE INVENTION

The above and other objects of the present invention are derived by using a scanning Surface Acoustic Wave ("SAW") device to provide contactless measurement of individual performance characteristics of each diode of a photodiode detector array, before that array is mated with a CCD or other readout device.

The SAW device of the present invention has one or more curved interdigital finger pairs ("IDTs") placed on each end of the device separated by a slotted waveguide, together with multiplexers, electronic drivers and signal processing electronics. The photodiode mosaic or array to be tested is positioned on the SAW device, such that each row of detectors is positioned between an input and output IDT, and over a waveguide. Use of the slotted waveguide confines the Raleigh wave to one row of detectors at a time and eliminates "crosstalk" between adjacent rows. Curved IDTs serve to generate a Raleigh wave and focus it at the beginning of the slotted waveguide. Device performance characteristics are measured by convolution scanning of each row of detectors with read and write pulses generated by the electronics drivers. Individual detector performance properties are "unscrambled" from the output SAW pulse using signal processing electronics. In this manner, the detector array may be tested quickly without contact or risk of electrical loading or physical damage. An additional advantage of the present invention is that it is compatible with current cryogenic technology which may be implemented to cool the detectors to be tested.

SAW devices have been used in a variety of situations, for example, to characterize bulk semiconductor material, and to characterize unknown radar signals. In material characterization, an electric field generated by the SAW pulse interacts with free carriers in the bulk semiconductor material from which an average measurement of the entire bulk material properties may be derived. In the radar application, a diode array with known electrical properties is used to store and correlate unknown radar signals. Thus, the present invention uses this well-known SAW technology, but in the reverse sense, i.e., a known acoustic signal is used to characterize unknown electrical properties of elements of a photodiode array.

BRIEF DESCRIPTION OF THE DRAWINGS

The above and other objects of the present invention are achieved in the illustrative embodiments as described with respect to the Figures in which.

DETAILED DESCRIPTION OF THE PREFERRED EMBODIMENT(S)

Figure 1:
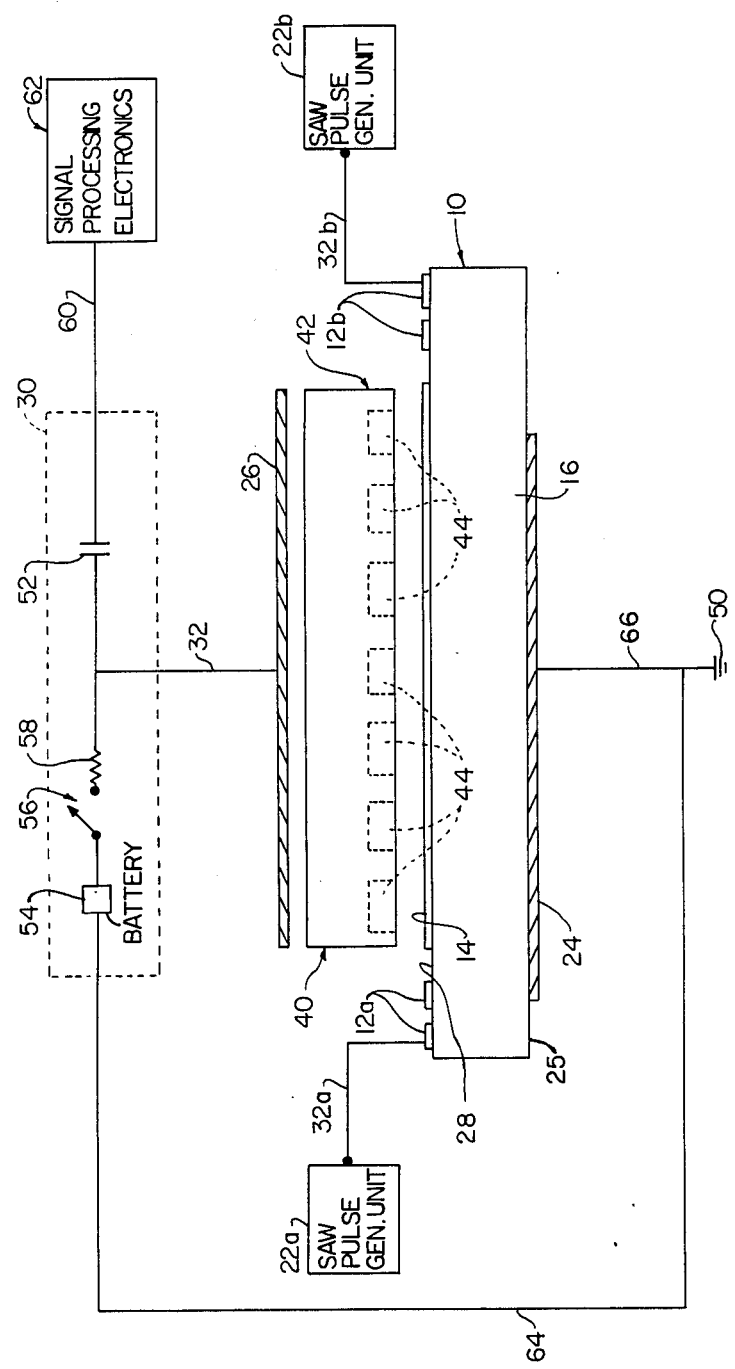
FIG. 1 shows a cross-section and schematic diagram of the apparatus of the present invention.
Figure 2:
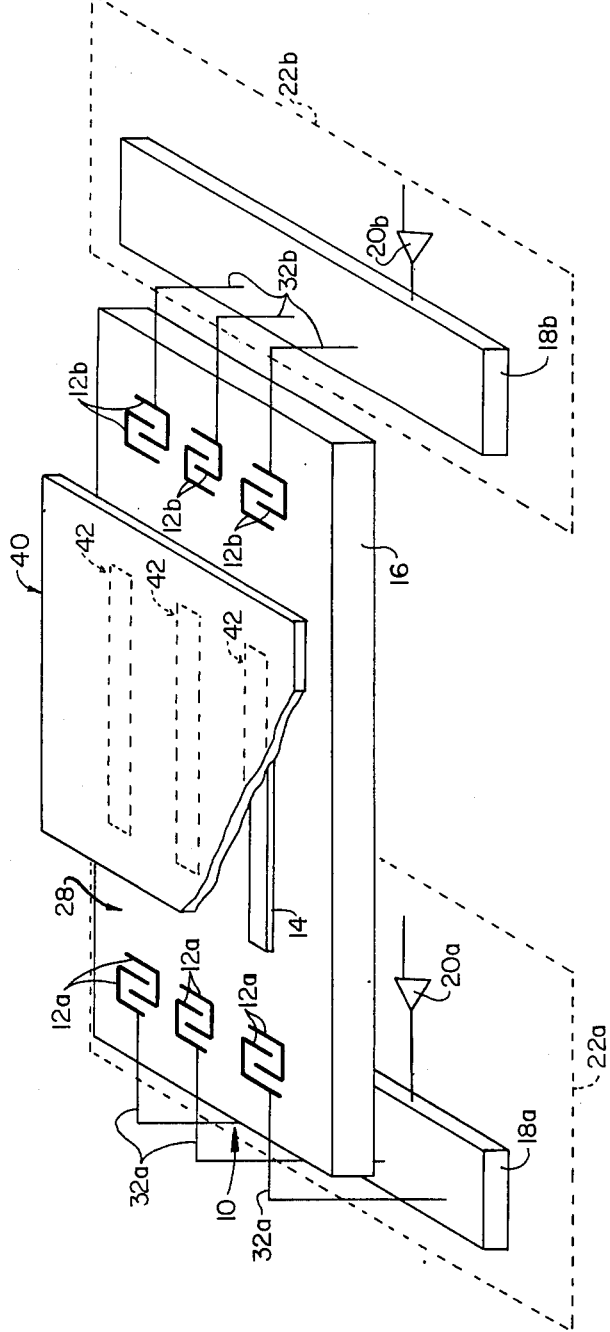
FIG. 2 shows an isometric view of the apparatus of the present invention.

Referring to FIGS. 1 and 2, the apparatus of the present invention includes a SAW device 10, SAW pulse generator electronics 22a and 22b, ground plate 24, pulse enabling plate 26, SAW enabling pulse circuitry 30, signal processing electronics 62, and a photodiode array or mosaic 40 to be tested. SAW device 10 includes IDT pairs 12a and 12b separated by waveguide 14 and are located on the top surface 28 of piezoelectric substrate 16 which has a bottom surface 25. SAW pulse generation electronics 22a and 22b each include electronic drivers 20a and 20b, respectively, and multiplexer units 18a and 18b, respectively. Signal processing electronics 62 contains a data acquisition unit, computer memory, processing electronics and output devices for storing the SAW output signals, algorithms and some means of operator display.

Detector device 40 is placed over SAW deivce 10, such that each detector row 42 is positioned between IDT pairs 12a and 12b and directly over waveguide 14. The distance between devices 10 and 40 will typically be 200–300 nanometers, which may be maintained by means of posts and rails as described by S. Stueflotten, "PN-Diode Array Optical Images Scanned With A Single Acoustic Surface Wave Pulse", Appl. Phys. Letters, Vol. 36, No. 7, p. 528, Apr. 1, 1980.

A radio frequency (RF) electrical signal is generated by unit 22a and transmitted via each line 32a to an IDT 12a, causing a mechanical-electrical surface wave ("Raleigh wave") to be propagated in piezoelectric substrate 16 in the direction of IDT 12b. The multiplexer 18a selectively routes electrical signals driven by driver 20a to the first IDT, then to the second IDT after the first Raleigh wave has transversed the length of the detector row 42. The SAW pulse generator units 22a and 22b are described in D. Chase, "Large Scale Data Acquisition Systems—A Systems Approach", Conf. on State of the Art Data Acquisition Systems, 1980. Electro-professional Programs, Boston, Ma, May 13–15, 1980. The wave is confined to the region directly below the detector row 42 by waveguide 14. If necessary, absorbing material, such as wax (not shown) may be placed at either end of the SAW device 10 in order to reduce acoustic reflections from the ends of device 10. If the geometry of output IDT 12b matches that of input IDT 12a, the Raleigh wave will be converted to a pure electrical signal when it reaches the receiving IDT 12b.

The "probing" action of device 10 is the perpendicular component of the electric field associated with the surface Raleigh wave as it passes through piezoelectric substrate 16. This field extends an acoustic wavelength both above and below surface 28 of SAW device 10. Interacting with free carriers below the surface of the semiconductor device 40, the electric field induces formation of local charge variation within the N+ diode region of device 40. The distribution and strength of these charge variations will parallel the spatial periodicity of the RF field.

However, zero biased diodes, such as diodes 44 in device 40, will not normally interact with an RF field such as that induced by the Raleigh wave because that field is typically in the megahertz range. In order to achieve the desired interaction, each diode 44 in detector row 42 must be momentarily forward biased by application of an enabling voltage while the Raleigh wave is transmitted across surface 28 of device 10. In essence, this monomentary flash forward biasing pulse creates a "snapshot" of the electric field variations induced by the Raleigh wave, which may be compared to a second later "snapshot" in order to evaluate individual diode characteristics.

FIG. 1 shows one method of forward biasing diodes 44 by using enabling pulse circuitry 30 in combination with pulse enabling plate 26 and SAW device ground plate 24 connected to ground 50. Circuitry 30 includes battery 54, switch 56, resistor 58 and capacitor 52 connected, as shown, to plate 26 via enabling pulse input line 32, and to signal processing electronics 62 via read output signal line 60. Circuitry 30 is also connected to ground 50 via ground lines 64 and 66. When switch 56 is closed, a positive DC pulse, approximately a nanosecond long, is produced via line 32 and plate 26 across devices 40 and 10 to ground plate 24 and ground 50. The diodes 44 are then forward biased and may interact with the RF field created by the Raleigh wave. After the DC pulse is removed, the diodes 44 are reverse biased due to the charge accumulated during the period of forward bias.

After charging each of the diodes to the same amount by the aforementioned biasing technique, subsequent Raleigh waves are launched. Each Raleigh wave will nondestructively interact with the charge remaining on each diode. This interaction may be measured as a voltage pulse on line 60. Poor performing diodes will leak charge at a faster rate than acceptable ones. Thus, there will be less interaction output voltage from poor diodes.

Plate 26 may be made of aluminum placed in close proximity to device 40, or may include silver paint or aluminum deposited directly on the P substrate back surface of device 40. Similarly, plate 24 may include silver paint applied directly to SAW device 10 or vacuum deposited aluminum gold, indium tin oxide, or some other conductor. If desired, a transparent thickness of conductor might be applied such that device 40 can also be examined spectroscopically while mounted on device 10 by other test equipment not shown.

The charge placed on each diode 44 as a result of the "write" SAW pulse will dissipate at a rate which is proportional to its $r_o$. The amount of charge decay for each element 44 is determined by sending a second SAW "read" pulse across device 10 at a time "t" after the initial "write" pulse. This second read pulse may be a single pulse generated from either units 22a or 22b, or may include a series of pulses generated from both units 22a and 22b which result in a convolution scan of the detector 42.

In either case, the electric field generated by the SAW interacts with those charges still remaining on diodes 44, generating a voltage spike on lines 32 and 60 for each successive diode 44 as it traverses surface 28 from one end of row 42 to the other. The voltage spike for each diode 44 is proportional to the amount of charge remaining on that diode. The size of each voltage spike is transferred on line 60 and stored and analyzed by signal processing electronics 62, from which the $r_o$ or other characteristics of each diode may be calculated, as described below.

As an example, in one embodiment of the present invention, a single write pulse is generated by unit 22a, creating a SAW wave which propagates across surface 28 from IDT 12a toward IDT 12b. As a result of this SAW pulse, each diode 44 in row 42 will store a charge (q) proportional to the strength of the field at that point. This charge distribution is represented by the expression C(2z/v), where "z" is the distance of acoustic propagation and "v" is the acoustic velocity. At a time (t) later, a second read pulse (R) represented by the functional description R(t−2z/v) may be propagated from unit 22b which may be correlated with the expression C(2z/v) to yield signal S(t), which is monitored via lines 32 and 60 by signal processing electronics 62; where:

$$S(t) = \cos(2wt) \int_{-L/2}^{+L/2} C(2z/v) \cdot R(t - 2z/v)dz \qquad (1)$$

where "w" is the SAW read pulse frequency and "L" is the length of the diode row 42. By repeated readout of row 42, the time (T) for each diode 44 to decay may be determined. It is understood that the "read" pulse could be generated from unit 22b as well. In this case, the read pulse would be represented by the expression R(t+2z/v), which woud be substituted in equation (1) above in place of the expression R(t−2z/v).

From this, the reverse bias saturation current ($I_s$) may be calculated based on the following equation.

$$I_s = q/T. \tag{2}$$

The quantity "q" on each diode 44 may be either calculated or determined empirically. The zero bias resistance $r_o$ for each diode may be caluculated as follows:

$$\frac{1}{r_o} = \left(\frac{dI}{dv}\right)_{v=0} = Isq/kT; \tag{3}$$

where T' = temperature of the diode 44.

If detector area "a" is known, the product $r_o a$ may also be easily calculated.

In a second embodiment, no enabling flash pulse is used to forward bias diodes 44. Instead, oppositely directed pulses from units 22a and 22b, represented by expressions F(t−z/v) and G(t+z/v) respectively, are used to form a convolution product C(2z/v) which imparts a charge q on each diode 44. This process has the advantage that it requires less voltage then required to "flash" the diode, as described above. The starting charge ($Q_o$) on each diode, is then represented as follows:

$$Q_o = \cos(2kz) \int_0^{T_o} F(t - z/v) \cdot G(t + z/v) dt, \tag{4}$$

where $T_o$ is the time duration of pulses F and G.

This relationship is described in the paper by C. Maerfeld, Ph. Defranoud and P. Tournois, entitled "Acoustic Storage and Processing Device Using P-N Diodes", Appl. Phys. Letters, Vol. 27, no. 11, p. 577, 1 Dec. 1975. The $r_o a$ for each diode is then determined in the same manner as described above.

The charge on a reverse biased detector diode, such as diodes 44, will decay substantially linearly at a rate which is proportional to that diode's $r_o a$. Therefore, for any given diode design, a table may be constructed which relates each value of $r_o a$ to the rate of decay of a charge on that diode. Thus, the process of calculating $r_o a$ may be accelerated by "reading" the detector row several times in rapid succession from which the rate of charge decay may be calculated. This rate of decay can then be compared against the table to determine each diode's $r_o a$.

The SAW pulse frequency for read or write functions is determined from the expected diode charging time, and, therefore, device sampling considerations. According to the Nyquist theorem, discussed in K. Ingebrigtsen, "The Schottky Diode Acoustic Memory and Correlator-A Novel Programmable Signal Processor", Proc. of IEEE, Vol. 64, no. 5, p. 764, May 5, 1976, there must be at least two diodes per acoustic wavelength. Then, for a detector row having 0.002 inch square diodes spaced 0.004 inch center-to-center, the acoustic frequency (f) in a SAW device havng a lithium niobate substrate 16 would be:

$$f = \frac{v}{l} = \frac{v}{2s} \tag{5}$$

where "v" is the Raleigh wave velocity, "l" is the acoustic wavelength and "s" is the diode spacing. Assuming wave velocity of 3500 m/sec in lithium niobate, and diode spacing on the order of 100 micrometers, f would be approximately 17.5 MHz, with a desired RF period "P" of approximately $5.7 \times 10^{-8}$ seconds.

The period (P) must also be less than the charging time (t) of the diode, where $$t = r_o c$$

where "c" is the capacitance of the diode.

In the example given above, assuming a mercury cadmium telluride diode array is being tested, $r_o$ would be approximately 10,000 ohm-cm², and "c" would be approximately $3 \times 10^{-8}$ F/cm², creating a diode charging time of approximately $3 \times 10^{-4}$ seconds. Thus, for a 35 MHz RF signal in lithium niobate, the RF period "P" would be less than the charging time "t" and both conditions would be satisfied.

In practice, both substrate type and the SAW frequency may be varied to achieve a desirable sampling frequency for the diode array design to be tested. For example, substrate 16 might also be made of lithium niobate, quartz, zinc oxide, gallium arsenide or any member of the PZT piezoelectric ceramic family.

The optimum duration of the pulse enabling used to forward bias device 42 may be calculated as a function of the RF period (P). As described in K. Ingebrigtsen and E. Stern, "Coherent Integration and Correlation in a Modified Acoustoelectric Memory Correlator", Appl. Phys. Letters, Vol. 27, no. 4. p. 170, Aug. 15, 1975, the bias pulse should be approximately one-half the RF period.

Figure 3:
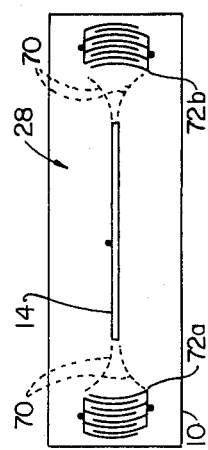
FIG. 3 shows a top view of one pair of curved, focusing IDTs and waveguide of the present invention.

As shown in FIG. 1, the apparatus of the present invention may include a single SAW device having one set of IDTs which could be used to test a simple linear array of photodiodes, or which could be mechanically positioned under successive detector rows in order to test a two-dimensional detector mosaic. In an alternate embodiment, as shown in FIG. 2, the present invention might include an array of IDT sets on a single SAW substrate 16 in order to test an entire mosaic without repositioning the detector mosais to test each row. It is understood that size constraints might require staggering the IDT sets on each end of substrate 16 in order to achieve the packing required to test a given mosaic.

Where multiple sets of IDTs are used, it may be necessary to confine the SAW to the area directly beneath each diode row 42 so that the SAW pulse effects only one row at a time, thereby reducing crosstalk between adjacent diode rows. As shown in FIG. 3, this may be achieved by using focussed IDT pairs 72a and 72b, rather than conventional interleaved IDT pairs 12a and 12b. Waveguide 14 further constrains the SAW to the area directly below detector row 42. As an example, waveguide 14 may include a convex or concave trough on surface 28. This configuration provides the added advantage that it reduces errors in estimating field strength at each diode which would normally result from misalignment of the row 42 relative to the IDT pairs 12a and 12b on 72a and 72b. Focused IDTs and SAW waveguide devices are described in, respectively, J. Green and G. Kino, "SAW Convolvers Using Focused Interdigital Transducers", IEEE Transactions on Sonics and Ultrasonics, Vol. 30, no. 1, p. 43, Jan. 1, 1983. and A. Oliner. "Waveguides for Acoustic Surface Waves: A Review", Proc. of IEEE, Vol. 64, no. 5, p. 615, May, 1976.

A possible configuration of the present invention may make use of several such IDTs and waveguide units, one for each row of detectors to be characterized. Another possible configuration may be the use of only one such IDT/waveguide unit combined with a mechanical translation stage to shift the IDT/waveguide to an adjacent row of detectors.

Having described the invention, what is claimed as new and novel and for which it is desired to secure Letters Patent is:

1. A nondestructive, contactless apparatus for testing an array of semiconductor diodes in which the diodes are arranged in rows, comprising:
   a surface acoustic wave generator;
   means of energizing said surface acoustic wave generator to propagate a surface acoustic wave pulse along a path;
   means for mounting said array of diodes adjacent said surface acoustic wave generator with a row of said diodes spaced therefrom so that said surface acoustic wave interacts with said diodes;
   means for energizing said surface acoustic wave generator to generate a first surface acoustic wave pulse to store a charge on each of said diodes along said row;
   means for energizing said surface acoustic wave generator to generate a second acoustic wave pulse at a predetermined interval following said first pulse; and
   means responsive to the interaction of said second pulse with said semiconductor diodes along said row to indicate a characteristic of said semiconductor diode as a function of its ability to store said charge over said predetermined interval.

2. A nondestructive, contactless apparatus for testing an array of semiconductor diodes in which the diodes are arranged in rows, comprising:
   a surface acoustic wave generator having a surface acoustic wave guide;
   means of energizing said surface acoustic wave generator to propagate a surface acoustic wave pulse along a path defined by said guide;
   means for mounting said array of diodes adjacent said surface acoustic wave generator with a row of said diodes aligned with said wave guide and spaced therefrom so that said surface acoustic wave interacts with said diodes;
   means for energizing said surface acoustic wave generator to generate a first surface acoustic wave pulse propagating along said guide to store a charge on each of said diodes along said row;
   means for energizing said surface acoustic wave generator to generate a second acoustic wave pulse propagating along said guide at a predetermined interval following said first pulse; and
   means responsive to the interaction of said second pulse with said semiconductor diodes along said row to indicate a characteristic of said semiconductor diode as a function of its ability to store said charge over said predetermined interval.

3. A nondestructive, contactless apparatus for testing an array of semiconductor diodes as in claim 2 wherein said surface acoustic wave generator has a plurality of guides and said means for mounting aligns a plurality of said rows respectively with said plurality of guides.

4. A nondestructive, contactless apparatus for testing an array of semiconductor diodes as in claim 3 wherein said wave guides focus said surface acoustic wave pulses so that an acoustic pulse propagated along a row of diodes interacts substantially only with diodes in the row aligned with the wave guide.

5. A nondestructive, contactless apparatus for testing an array of semiconductor diodes as in claim 3 wherein said wave guide includes a convex rib.

6. A nondestructive, contactless apparatus for testing an array of semiconductor diodes as in claim 3 wherein said wave guide includes a concave trough.

7. A nondestructive, contactless apparatus for testing an array of semiconductor diodes as in claim 1 further including means to forwardly bias said diodes at the time said first acoustic pulse interacts with said diode.

8. A nondestructive, contactless apparatus for testing an array of semiconductor diodes as in claim 2 further including means to forwardly bias said diodes at the time said first acoustic pulse interacts with said diode.

9. A nondestructive, contactless apparatus for testing an array of semiconductor diodes as in claim 3 further including means to forwardly bias said diodes at the time said first acoustic pulse interacts with said diode.

10. A nondestructive, contactless apparatus for testing an array of semiconductor diodes as in claim 7 wherein said means for forward biasing said diodes includes a pair of plates, means for producing a pulse, and means for supporting said plates in proximity to a diode array in said mounting means so that a pulse produced by said pulse producing means propagates from said first plate through said diodes to said second plate.

11. A nondestructive, contactless apparatus for testing an array of semiconductor diodes as in claim 1 wherein said first pulse is a convolution product of two pulses propagating in opposite directions along said wave guide.

12. A method for nondestructively, contactlessly testing an array of diodes in which the diodes are arranged in rows, comprising of these steps:
   propagating a first surface acoustic wave pulse along a row in said diode array to store a charge on said diodes;
   generating a second surface acoustic wave pulse along said row at a predetermined interval after said first surface acoustic wave pulse;
   monitoring the interaction of said second acoustic wave pulse with said diodes to indicate a characteristic of said diodes as a function of their ability to store said charge.

13. A method as in claim 12 further including the step of forward biasing each of said diode at the time said acoustic wave pulse interacts with said diode.

14. A method as in claim 13 wherein said first pulse is a convolution product of two pulses propagating in opposite directions along said wave guides.

* * * * *